(12) United States Patent
Mahajan et al.

(10) Patent No.: US 7,633,764 B2
(45) Date of Patent: Dec. 15, 2009

(54) BALL GRID ARRAY CONFIGURATION FOR REDUCING PATH DISTANCES

(75) Inventors: Abhijit Mahajan, Bangalore (IN); Ali Sarfaraz, Alamo, CA (US)

(73) Assignee: Broadcom Corporation, Irvine, CA (US)

( * ) Notice: Subject to any disclaimer, the term of this patent is extended or adjusted under 35 U.S.C. 154(b) by 460 days.

(21) Appl. No.: 11/115,769

(22) Filed: Apr. 27, 2005

(65) Prior Publication Data

US 2006/0245228 A1 Nov. 2, 2006

(51) Int. Cl.
*H05K 7/00* (2006.01)
(52) U.S. Cl. ...................... 361/760; 361/764
(58) Field of Classification Search ............. 361/760, 361/749–751, 764; 174/253, 254, 260
See application file for complete search history.

(56) References Cited

U.S. PATENT DOCUMENTS

| | | | |
|---|---|---|---|
| 5,982,653 A | 11/1999 | Chu | |
| 6,134,701 A | 10/2000 | Chen | |
| 6,434,016 B2 * | 8/2002 | Zeng et al. | 361/760 |
| 6,731,527 B2 * | 5/2004 | Brown | 365/63 |
| 2002/0156538 A1 * | 10/2002 | Chang | 700/2 |

FOREIGN PATENT DOCUMENTS

| DE | 3123620 | * | 1/1983 |
|---|---|---|---|
| DE | 3123620 A1 | | 1/1983 |

* cited by examiner

*Primary Examiner*—Dean A. Reichard
*Assistant Examiner*—Yuriy Semenenko
(74) *Attorney, Agent, or Firm*—McAndrews Held & Malloy, Ltd.

(57) ABSTRACT

Presented herein are ball grid array configurations for reducing path distances. In an exemplary embodiment, there is presented a memory system. The memory system comprises a printed circuit board, a memory controller, and a memory. The printed circuit board comprises a first layer and a second layer. The memory controller comprises a first plurality of pins connected to the first layer and a second plurality of pins connected to the second layer. The memory comprises a first plurality of pins connected to the first layer and a second plurality of pins connected to the second layer. The first layer comprises a plurality of connection paths connecting the first plurality of pins of the memory to the first plurality of pins of the memory controller. The second layer comprises a plurality of connection paths connecting the second plurality of pins of the memory to the second plurality of pins of the memory controller.

9 Claims, 3 Drawing Sheets

BALL GRID ARRAY CONFIGURATION FOR REDUCING PATH DISTANCES

RELATED APPLICATIONS

[Not Applicable]

FEDERALLY SPONSORED RESEARCH OR DEVELOPMENT

[NOT APPLICABLE]

MICROFICHE/COPYRIGHT REFERENCE

[NOT APPLICABLE]

BACKGROUND OF THE INVENTION

Memory systems typically include memory and a memory controller. The memory can comprise a variety of devices such as Single Data Rate Random Access Memory (SD-RAM) or Double Data Rate Random Access Memory (DD-RAM). The memory is typically packaged as an integrated circuit. The memory controller is typically packaged as another integrated circuit.

The memory and the memory controller are typically connected to each other over a printed circuit board. The memory and memory controller are typically packaged as TSOP (This Small Outline Package) and ball grid array respectively. Ball grid arrays are arrays of electrical contacts, known as pins, that are physically accessible by components that are outside of the integrated circuit. The array has a uniform spacing between all the pins. The ball grid arrays are soldered to the printed circuit board. Connection paths are etched onto the printed circuit board interconnecting various pins from the memory and the memory controller. The thin small outline package (referred to as TSOP) typically comprises of two rows of pins that are arranged on each of the longer side of the device. These rows of pins have a fixed pitch (spacing) between each pin.

The Joint Electron Device Engineering Committee has promulgated standards standardizing the thin small outline packaging (TSOP) pin configuration for synchronous double data rate DRAMs. Pursuant to the standard, DDR-SDRAMs are typically rectangular in shape and include a row of pins along two longer sides of the rectangle.

The memory controller accesses each of the pins on the DDR-SDRAM. However, because the pins are along opposite sides of the DDR-SDRAM, the connection paths connecting pins on the memory controller to the pins on the DDR-SDRAM are often indirect and complex. Indirect paths are also longer than direct paths. It is desirable for connection paths to be as short as possible to prevent susceptibility to noise and signal attenuation. Arranging the ball grid array pins on the controller in a particular manner, shortens the path length considerably. Where the connection path is long, resistors are often used to compensate and damp out the noise to enhance signal quality. However, adding resistors increases costs and complexity.

Further limitations and disadvantages of conventional and traditional approaches will become apparent to one of skill in the art, through comparison of such systems with some aspects of the present invention as set forth in the remainder of the present application with reference to the drawings appended hereto.

SUMMARY OF THE INVENTION

Presented herein are system(s), method(s), and/or apparatus for a ball grid array configuration for reducing path distances, substantially as shown in and/or described in connection with at least one of the figures, as set forth more completely in the claims.

These and other features and advantages of the present invention may be appreciated from a review of the following detailed description of the present invention, along with the accompanying figures in which like reference numerals refer to like parts throughout.

DETAILED DESCRIPTION OF THE INVENTION

Aspects of the present invention may be found in an electronic device(s) employing a ball grid array (BGA) for operatively connecting and attaching/mounting chip packages to circuit boards, for example. A BGA may comprise a surface-mountable integrated circuit/chip package in which the integrated circuit/chip package may be operatively connected and attached to a printed circuit board by employing solder balls which are surface mounted, instead of permanently/semi-permanently attached metal leads (pins) employed in PGA packaging, for example.

A ball grid array (BGA) may comprise a chip package having solder balls applied/disposed along an underside of the chip package, for example. The solder balls may be employable for mounting the chip package to a printed circuit board (PCB), for example. The solder balls may be employable for conductively/operatively connecting inputs/outputs of the chip package to associated connection points on a printed circuit board (PCB), for example. A ball grid array may be a type of chip package connection methodology employing a plurality of solder dots, or balls, arranged to permit interaction between the chip package and the printed circuit board.

Aspects of the present invention may be found in employing a ball grid array (BGA) to reduce connection paths, provide enhanced electrical performance, provide better heat dissipation, provide greater module density on printed circuit boards, and enhance signal transmission quality, signal transmission speed, and signal reception characteristics.

Figure 1:
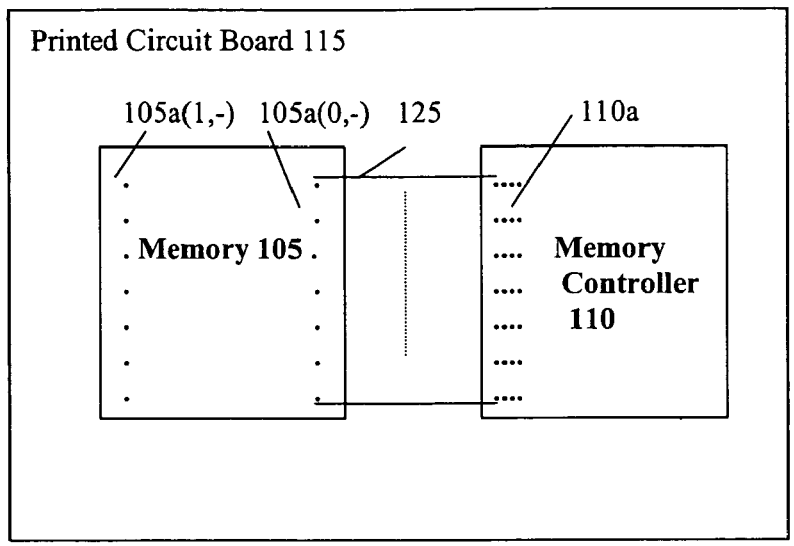
FIG. 1 is a block diagram describing a memory system in accordance with an embodiment of the present invention.

Referring now to FIG. 1, there is illustrated a block diagram a memory system 100 in accordance with an embodiment of the present invention. The memory system 100 comprises a memory 105 and a memory controller 110. The memory 105 can comprise, for example, an DDR-SDRAM or the like, and is packaged as an integrated circuit. The memory controller 110 is packaged as another integrated circuit.

The memory 105 and the memory controller 110 connected to each other over a printed circuit board 115. The memory 105 includes a TSOP packaging and memory controller 110 include ball grid arrays, 105a, 110a, respectively. Ball grid arrays, e.g., 110a, are arrays electrical contacts, known as pins, that are physically accessible by components that are outside of the integrated circuit. The ball grid arrays 105a, 110a are soldered to the printed circuit board 115. Connection paths 125 are etched onto various layers of the printed circuit board interconnecting various pins from the memory and the memory controller. Vias are employed to gain access to the inner and bottom layers of the printed circuit board.

The Joint Electron Device Engineering Committee has promulgated standards standardizing the pin arrangement for DDR-SDRAMs packaged in a TSOP packaging. Pursuant to the standard Double Data Rate SDRAM Specification (Document Number: JESD97(D,C), which is incorporated herein by reference, DDR-SDRAMs are typically rectangular in shape and include a row of pins 105a(0,–), 105a(1,–) along two opposite sides of the rectangle.

Figure 2:
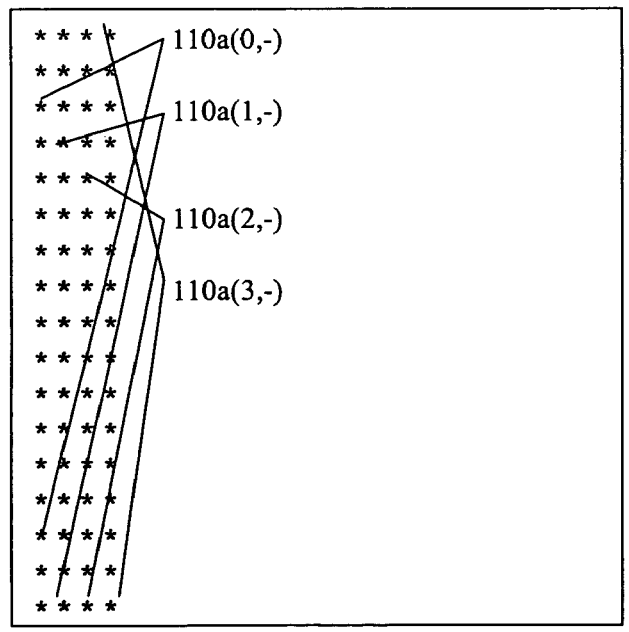
FIG. 2 is a block diagram of the memory controller in accordance with an embodiment of the present invention.

Referring now to FIG. 2, there is illustrated a block diagram of an exemplary memory controller 110. The memory controller 110 can be rectangular and comprises a ball grid array 110a. The ball grid array 110a comprises four rows of pins 110a(0,–), 110a(1,–), 110a(2,–), and 110a(3,–) along one edge of the rectangle. The rows are alternatingly signal and ground, such that the pins in rows 110a(0,–) and 110a(2,–) carry signals, and the pins in rows 110a(1,–) and 110a(3,–) are grounds or vice versa. According to certain aspects of the present invention, the four rows of pins 110a(0,–), 110a(1,–), 110a(2,–), and 110a(3,–) are along an edge of the rectangle that is nearest to the memory 105.

Figure 3:
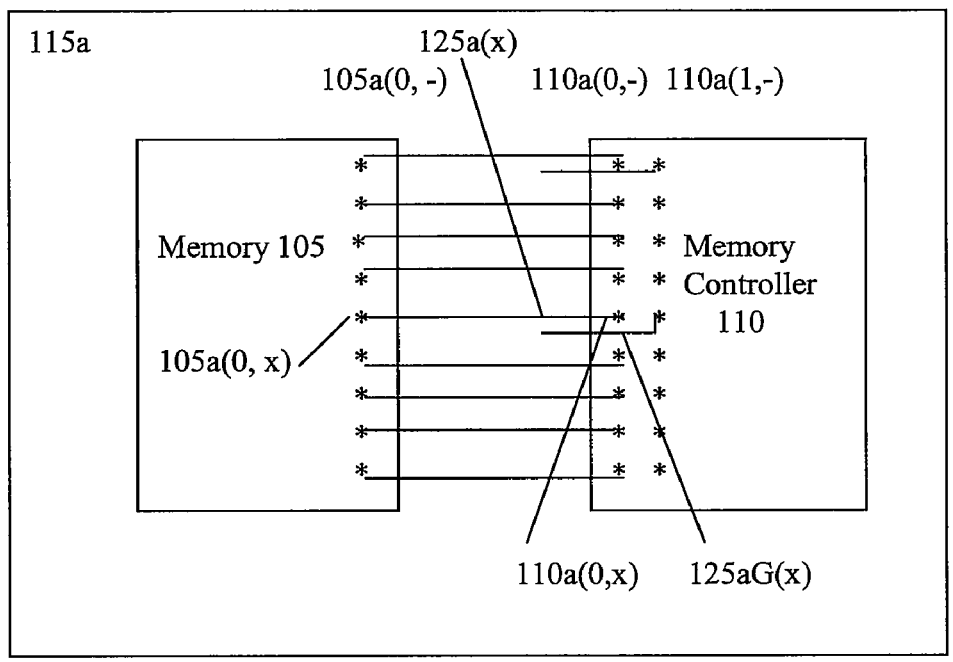
FIG. 3 is a block diagram of one layer of the memory system in accordance with an embodiment of the present invention.

Referring now to FIG. 3, there is illustrated a block diagram of one layer of the printed circuit board 115, in accordance with an embodiment of the present invention. The layer 115a faces the package housing of the memory 105 and the memory controller 110. The row of pins 110a(0,–) can be connected to the row of pins on the memory 105 that are nearest to the memory controller, e.g., row 105a(0,–). According to certain aspects of the present invention, the memory controller 110 can be configured, such that each sequential pin of row 110a(0,x) connects to a corresponding sequential pin of row 105a(0,x). Each pin of row 110a(0,x) can be connected to a corresponding pin of row 105a(0,x) by a connection path 125a(x). As can be seen, the connection path 125a(x) can be the most direct path between the pins.

Each pin of row 110a(1,x) can be connected to ground GRND by corresponding connection paths 125aG(x) that runs substantially along and between connection paths 125a(x) and 125a(x+1). In the foregoing manner, crosstalk between connection paths 125a(x) and 125a(x+1) are reduced.

Figure 4:
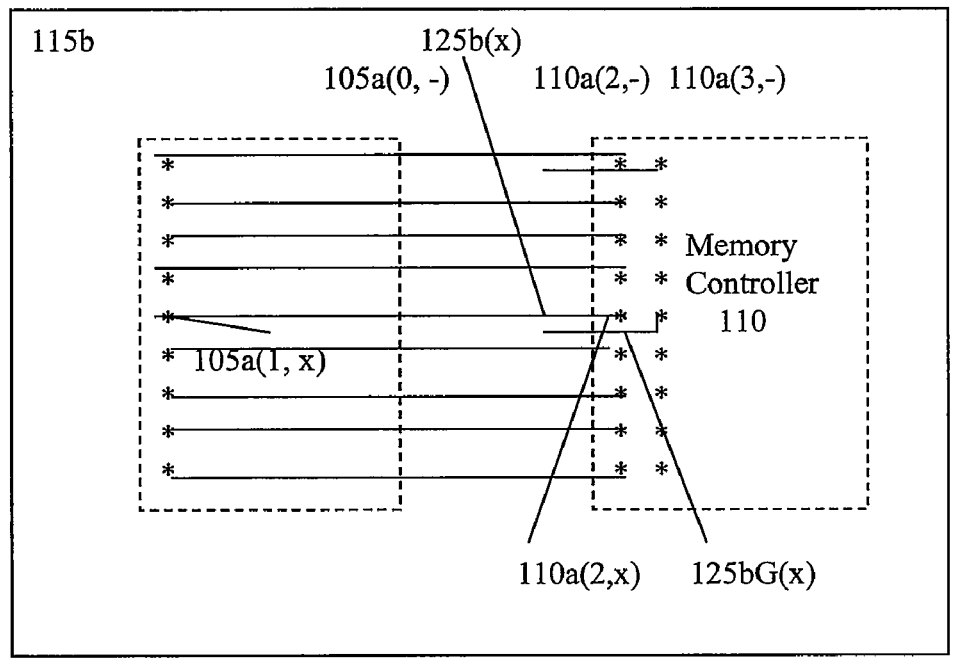
FIG. 4 is a block diagram of another layer of the memory system in accordance with an embodiment of the present invention.

Referring now to FIG. 4, there is illustrated a block diagram of another layer of the printed circuit board 115 in accordance with an embodiment of the present invention. The layer of printed circuit board 115b faces away from the package housing of the memory 105 and the memory controller 110. The rows of pins 105a(1), 110a(2,–) and 110a(3,–) are connected to layer 115b by what are known as vias 405. A via is a conductive hole that in the printed circuit board 115. A connection can be placed through the via 405 to make contact with layer 115b. The row of pins 110a(2,–) can be connected to the row of pins on the memory 105 that are furthest from the memory controller, e.g., row 105a(1,–). According to certain aspects of the present invention, the memory controller 110 can be configured, such that each sequential pin of row 110a(2,x) connects to a corresponding sequential pin of row 105a(1,x). Each pin of row 110a(2,x) can be connected to a corresponding pin of row 105a(1,x) by a connection path 125b(x). As can be seen, the connection path 125b(x) can be the most direct path between the pins.

Each pin of row 110a(3,x) can be connected to ground GRND by corresponding connection paths 125bG(x) that runs substantially along and between connection paths 125b(x) and 125b(x+1). In the foregoing manner, crosstalk between connections 125b(x) and 125b(x+1) and 125b(x) and 125b(x−1) are reduced.

Figure 6:
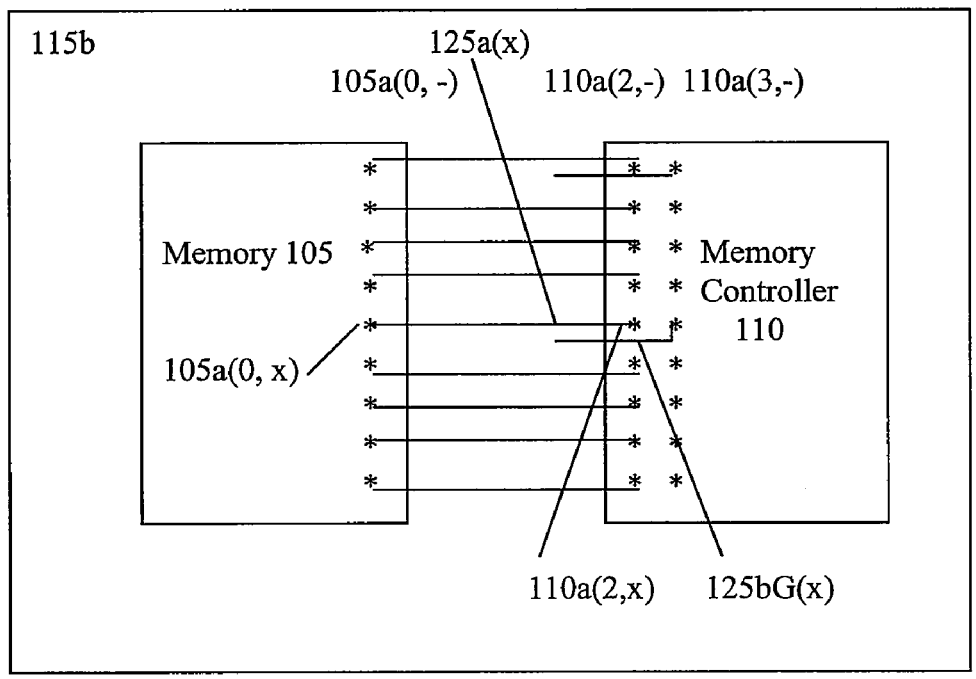
FIG. 6 is a block diagram of another layer of the memory system in accordance with an embodiment of the present invention.

Referring now to FIG. 6, there is illustrated a block diagram of one layer of the printed circuit board 115, in accordance with another embodiment of the present invention. The layer 115b faces the package housing of the memory 105 and the memory controller 110. The rows of pins 110a(2,–) and 110a(3,–) can be connected to the row of pins on the memory 105 that are nearest to the memory controller, e.g., row 105a(0,–). According to certain aspects of the present invention, the memory controller 110 can be configured, such that each sequential pin of row 110a(2,x) connects to a corresponding sequential pin of row 105a(0,x). Each pin of row 110a(2,x) can be connected to a corresponding pin of row 105a(0,x) by a connection path 125a(x). As can be seen, the connection path 125a(x) can be the most direct path between the pins.

Each pin of row 110a(3,x) can be connected to ground GRND by corresponding connection paths 125aG(x) that runs substantially along and between connection paths 125a(x) and 125a(x+1). In the foregoing manner, crosstalk between connections 125a(x) and 125(x+1) are reduced.

Figure 5:
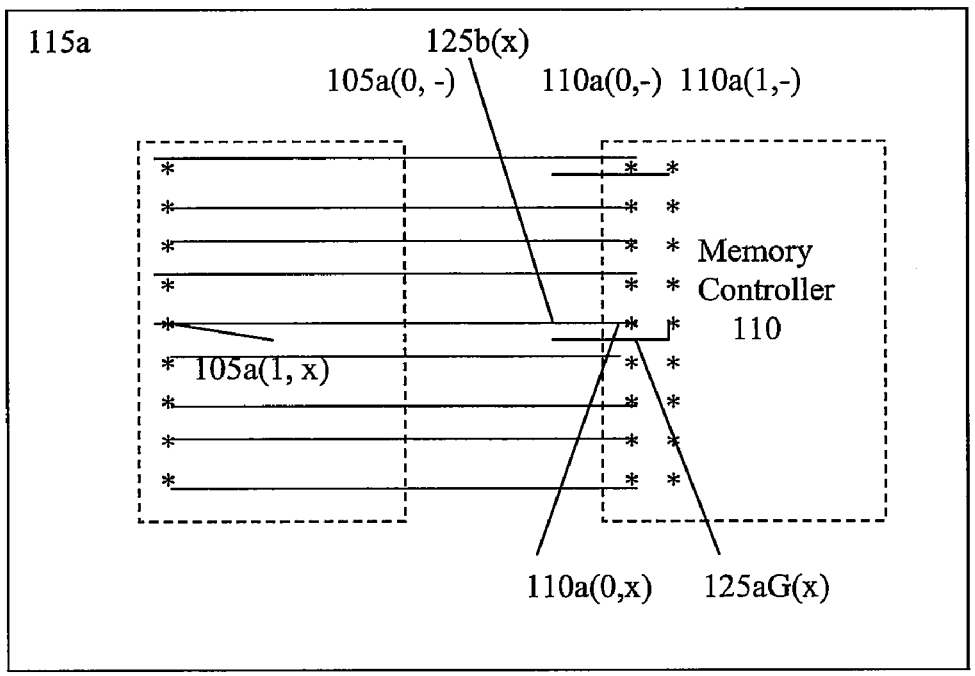
FIG. 5 is a block diagram of one layer of the memory system in accordance with an embodiment of the present invention.

Referring now to FIG. 5, there is illustrated a block diagram of another layer of the printed circuit board 115 in accordance with an embodiment of the present invention. The layer of printed circuit board 115a faces away from the package housing of the memory 105 and the memory controller 110. The rows of pins 105a(1,x), 110a(0,–) and 110a(1,–) are connected to layer 115b by vias 405. The row of pins 110a(0,–) can be connected to the row of pins on the memory 105 that are furthest from the memory controller, e.g., row 105a(1,–). According to certain aspects of the present invention, the memory controller 110 can be configured, such that each sequential pin of row 110a(0,x) connects to a corresponding sequential pin of row 105a(1,x). Each pin of row 110a(0,x) can be connected to a corresponding pin of row 105a(1,x) by a connection path 125b(x). As can be seen, the connection path 125b(x) can be the most direct path between the pins.

Each pin of row 110a(1,x) can be connected to ground GRND by corresponding connection paths 125bG(x) that runs substantially along and between connection paths 125b(x) and 125b(x+1). In the foregoing manner, crosstalk between connections 125b(x) and 125b(x+1) are reduced.

While the present invention has been described with reference to certain embodiments, it will be understood by those skilled in the art that various changes may be made and equivalents may be substituted without departing from the scope of the present invention.

In addition, many modifications may be made to adapt a particular situation or material to the teachings of the present invention without departing from its scope. Therefore, it is intended that the present invention not be limited to the particular embodiment disclosed, but that the present invention will include all embodiments falling within the scope of the appended claims.

The invention claimed is:

1. A memory system comprising:
a printed circuit board, said printed circuit board comprising a first layer and a second layer;
a memory controller comprising a first plurality of pins connected to the first layer and a second plurality of pins connected to the second layer;
a memory comprising a first plurality of pins connected to the first layer and a second plurality of pins connected to the second layer;
wherein the first layer comprises a plurality of connection paths connecting the first plurality of pins of the memory to the first plurality of pins of the memory controller;
wherein the second layer comprises a plurality of connection paths connecting the second plurality of pins of the memory to the second plurality of pins of the memory controller;
wherein first plurality of pins of the memory are disposed along a first edge of the memory and wherein the second plurality of pins of the memory are disposed along a second edge of the memory, and wherein the first edge of the memory is substantially opposite from the second edge of the memory;
wherein the first plurality of pins of the memory controller and the second plurality of pins of the memory controller are disposed along a particular edge of the memory controller; and
wherein the first plurality of pins of the memory controller are closer to the particular edge than the second plurality of pins of the memory controller, and wherein the first plurality of pins of the memory are closer to the memory controller than the second plurality of pins of the memory.

2. The memory system of claim 1, wherein the memory comprises Double Data Rate-Single Data Rate Random Access Memory (DDR-SDRAM).

3. The memory system of claim 1, wherein the memory controller comprises a third plurality of pins connected to the first layer and a fourth plurality of pins connected to the second layer, wherein the third plurality of pins and fourth plurality of pins carry ground signals.

4. The memory system of claim 1, wherein the memory comprises Joint Electron Device Engineering Committee (JEDEC) compliant memory.

5. The memory system of claim 1, wherein the printed circuit board comprises two opposite surfaces, and wherein the first layer comprises one of the two opposite surface, and wherein the second layer comprises the other of the two opposite surfaces.

6. A memory system comprising:
a memory for storing data, said memory comprising a first plurality of pins and a second plurality of pins;
a memory controller for accessing said data, said memory controller comprising a first plurality of pins and a second plurality of pins;
a printed circuit board for connecting the memory to the memory controller, said printed circuit board comprising a first layer connected to the first plurality of pins of the memory and the first plurality of pins of the memory controller and a second layer connected to the second plurality of pins of the memory and the second plurality of pins of the memory controller;
wherein the first layer comprises a plurality of connection paths for connecting the first plurality of pins of the memory to the first plurality of pins of the memory controller;
wherein the second layer comprises a plurality of connection paths for connecting the second plurality of pins of the memory to the second plurality of pins of the memory controller;
wherein first plurality of pins of the memory are disposed along a first edge of the memory and wherein the second plurality of pins of the memory are disposed along a second edge of the memory, and wherein the first edge of the memory is substantially opposite from the second edge of the memory;
wherein the first plurality of pins of the memory controller and the second plurality of pins of the memory controller are disposed along a particular edge of the memory controller; and
wherein the first plurality of pins of the memory controller are closer to the particular edge than the second plurality of pins of the memory controller, and wherein the second plurality of pins of the memory are closer to the memory controller than the first plurality of pins of the memory.

7. The memory system of claim 6, wherein the memory comprises Double Data Rate-Single Data Rate Random Access Memory (DDR-SDRAM).

8. The memory system of claim 6, wherein the memory controller comprises a third plurality of pins connected to the first layer and a fourth plurality of pins connected to the second layer, wherein the third plurality of pins and fourth plurality of pins carry ground signals.

9. The memory system of claim 6, wherein the memory comprises Joint Electron Device Engineering Committee (JEDEC) compliant memory.

* * * * *

UNITED STATES PATENT AND TRADEMARK OFFICE
CERTIFICATE OF CORRECTION

PATENT NO. : 7,633,764 B2 Page 1 of 1
APPLICATION NO. : 11/115769
DATED : December 15, 2009
INVENTOR(S) : Mahajan et al.

It is certified that error appears in the above-identified patent and that said Letters Patent is hereby corrected as shown below:

On the Title Page:

The first or sole Notice should read --

Subject to any disclaimer, the term of this patent is extended or adjusted under 35 U.S.C. 154(b) by 553 days.

Signed and Sealed this

Ninth Day of November, 2010

David J. Kappos
*Director of the United States Patent and Trademark Office*